United States Patent
An

(10) Patent No.: US 7,312,627 B2
(45) Date of Patent: Dec. 25, 2007

(54) DECODING CIRCUIT FOR ON DIE TERMINATION IN SEMICONDUCTOR MEMORY DEVICE AND ITS METHOD

(75) Inventor: Yong-Bok An, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 124 days.

(21) Appl. No.: 11/017,645

(22) Filed: Dec. 22, 2004

(65) Prior Publication Data

US 2005/0141327 A1 Jun. 30, 2005

(30) Foreign Application Priority Data

Dec. 29, 2003 (KR) .................. 10-2003-0098514

(51) Int. Cl.
*H03K 17/16* (2006.01)
*H03K 19/003* (2006.01)

(52) U.S. Cl. .................. 326/30; 326/105; 327/217; 365/230.06

(58) Field of Classification Search .................. 326/30, 326/105, 56–58; 323/17.3, 32; 324/601; 327/217; 365/230.06
See application file for complete search history.

(56) References Cited

U.S. PATENT DOCUMENTS

| | | | |
|---|---|---|---|
| 4,757,217 A * | 7/1988 | Sawada et al. ............ 327/19 |
| 4,975,884 A * | 12/1990 | Waller .................... 365/230.06 |
| 5,187,385 A * | 2/1993 | Koike .................... 327/198 |
| 5,357,622 A * | 10/1994 | Parks et al. ................ 711/117 |
| 5,708,623 A * | 1/1998 | Choi .................... 365/233 |
| 5,949,252 A * | 9/1999 | Taguchi .................... 326/86 |
| 6,272,577 B1 * | 8/2001 | Leung et al. ............... 710/110 |
| 6,448,807 B1 * | 9/2002 | Ahsanullah .................. 326/30 |
| 6,552,570 B2 * | 4/2003 | Taylor et al. ................ 326/82 |
| 6,628,223 B2 * | 9/2003 | Nagano .................... 341/155 |
| 7,019,556 B2 * | 3/2006 | Yoo .................... 326/30 |
| 2004/0000932 A1 * | 1/2004 | Jang .................... 326/105 |
| 2005/0116736 A1 * | 6/2005 | Blodgett et al. ............. 326/30 |
| 2005/0248362 A1 * | 11/2005 | Choe .................... 326/30 |

* cited by examiner

Primary Examiner—Rexford Barnie
Assistant Examiner—Jason Crawford
(74) Attorney, Agent, or Firm—Lowe Hauptman Ham & Berner LLP

(57) ABSTRACT

A decoding circuit of an on die termination (ODT) control signal for stably performing an ODT operation. The decoding circuit includes: a latch unit for receiving a plurality of input signals and for holding previous output signals of the latch unit when the plurality of input signals are in predetermined logic levels; and a decoding unit for decoding output signals of the latch unit in order to control ODT operation.

17 Claims, 3 Drawing Sheets

DECODING CIRCUIT FOR ON DIE TERMINATION IN SEMICONDUCTOR MEMORY DEVICE AND ITS METHOD

FIELD OF INVENTION

The present invention relates to on die termination (ODT) of a semiconductor memory device; and, more particularly, to a driving circuit for preventing an abnormal operation of the ODT.

DESCRIPTION OF PRIOR ART

An on die termination (ODT) technology has been introduced for improving signal integrity by minimizing signal reflection between a stub series termination logic II (SSTL II) based system and a semiconductor memory device.

Generally, a termination voltage (VTT) and a termination resistor (RTT) are provided by a motherboard. However, with development of a double data rate II synchronous dynamic random access memory (DDR-II SDRAM), the VTT and the RTT can be provided within a DRAM by using the ODT technology under control of a memory controller.

A termination of the DRAM is described below.

It is assumed that a memory module includes two ranks. If a memory controller reads data from a DRAM of a first rank rank1, an ODT signal of a logic high level is inputted to a DRAM of a second rank rank2. At this time, the DRAM of the second rank rank2 generates a termination on a data bus shared with the first rank rank1, i.e., a termination resistor (RTT) is generated.

Meanwhile, the above-mentioned ODT operation is controlled based on logic levels of addresses A6 and A2 inputted to be used for an extended mode register set (EMRS).

FIG. 1 is a block diagram showing a conventional ODT control circuit for controlling the ODT.

As shown, the conventional ODT control circuit includes an address buffer unit 110, a mode register set (MRS) address latch 120, an ODT decoder 130, an ODT driver 140 and an ODT 150.

An inputted address is latched by the MRS address latch 120 after being buffered by the address buffer unit 110. The ODT decoder 130 decodes an output signal of the MRS address latch unit 120. The decoded signal of the ODT decoder 130 is inputted to the ODT driver 140 in order to be outputted as a driver signal. Then, the ODT generates the RTT based on the driver signal.

Table. 1 shows an ODT operation according to a specification introduced by an international electronics standardization organization, i.e., the Joint Electron Device Engineering Council (JEDEC).

As shown in Table. 1, if both of the addresses A6 and A2 are in a logic high level, the RTT is not defined.

TABLE 1

| A6 | A2 | RTT |
|---|---|---|
| 0 | 0 | ODT Disable |
| 0 | 1 | 75 ohms |
| 1 | 0 | 150 ohms |
| 1 | 1 | Reserved |

FIG. 2 is a schematic circuit diagram showing a control circuit for performing the operations shown in Table. 1. Since operations of the control circuit are the same as the above-mentioned operations, detailed description of the operations of the control circuit is omitted. However, explanations for external signals are described below.

An ODT command signal ODT_delay is inputted to an ODT driver 240 for performing the ODT operation of logic low level. Thereafter, EMRS data signals mregi2 and mregi6, which corresponds to the addresses A2 and A6, are inputted to an MRS latch 220. At the same time, an EMRS trigger signal emreg_lat is inputted to the EMRS latch 220 in order to latch the EMRS data signals mregi2 and mregi6.

Table. 2 shows output signals of an ODT decoder 230 according to the addresses A6 and A2.

As shown, the ODT decoder 230 outputs same signals when both of the addresses A6 and A2 are in a logic high level and both of the addresses A6 and A2 are in a logic low level. That is, according to the conventional ODT control circuit, if the addresses A6 and A2 become in a logic high level due to a noise or a glitch, the ODT may be disabled as shown in Table. 1.

TABLE 2

| A6 | A2 | S1 | S2 |
|---|---|---|---|
| 0 | 0 | 0 | 0 |
| 0 | 1 | 1 | 1 |
| 1 | 0 | 0 | 1 |
| 1 | 1 | 0 | 0 |

Therefore, a semiconductor memory device may abnormally perform the ODT operation.

SUMMARY OF INVENTION

It is, therefore, an object of the present invention to provide a semiconductor memory device capable of stably performing the ODT operation.

In accordance with an aspect of the present invention, there is provided a decoding circuit of an on die termination (ODT) control signal, including: a latch unit for receiving a plurality of input signals and for holding previous output signals of the latch unit when the plurality of input signals are in predetermined logic levels; and a decoding unit for decoding output signals of the latch unit in order to control ODT operation.

In accordance with another aspect of the present invention, there is provided an ODT driving circuit for use in a semiconductor memory device, including: a mode register set latch for latching an extended mode register set (EMRS) data simultaneously receiving the EMRS data and a trigger signal; a latch unit for receiving a plurality of input signals outputted from the mode register set latch and for holding previous output signals of the latch unit when the plurality of input signals are in predetermined logic level; a decoding unit for decoding output signals of the latch unit in order to control ODT operation; a driving unit for generating an ODT driving signal based on output signals of the decoding unit; and an ODT unit for generating a termination resister (RTT) based on the ODT driving signal.

In accordance with further another aspect of the present invention, there is provided a method for decoding an ODT control signal, including the steps of: a) receiving a plurality of input signals and holding previous output when the plurality of input signals are in predetermined logic levels; and b) decoding the plurality of input signals when the plurality of input signals are not in the predetermined logic levels.

In accordance with further another aspect of the present invention, there is provided a method for driving an ODT in a semiconductor memory device, including the steps of; a) latching an EMRS data by simultaneously receiving the EMRS data and a trigger signal; b) receiving a plurality of input signals generated at the step of a) and holding output signals if the plurality of input signals are in predetermined logic levels; c) decoding output signals generated at the step of b); d) generating an ODT driving signal based on output signals generated at the step of c); and e) generating a termination resistor (RTT) based on the ODT driving signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an on die termination (ODT) control circuit for use in a semiconductor memory device in accordance with the present invention will be described in detail referring to the accompanying drawings.

Figure 3:
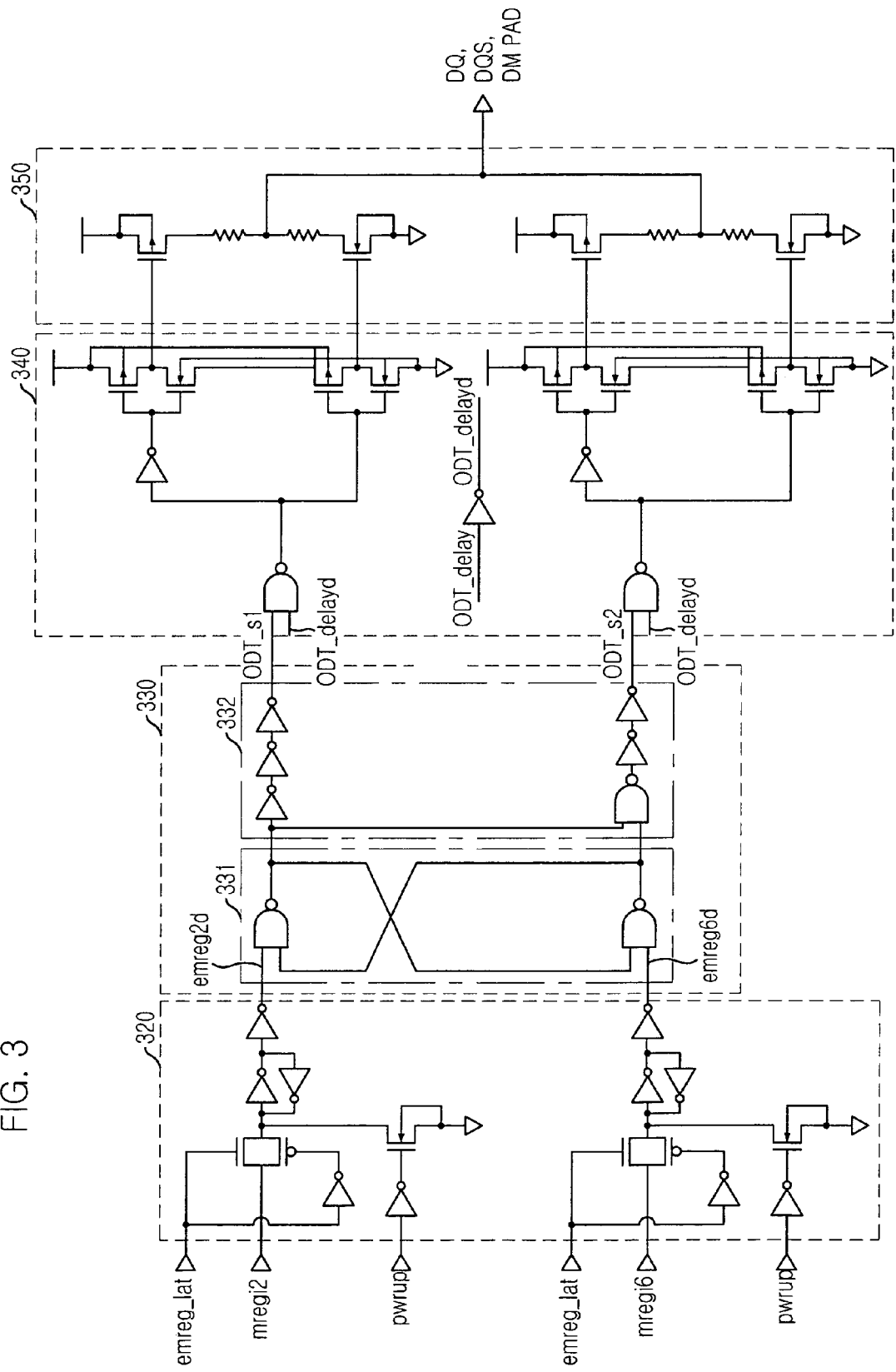
FIG. 3 is a schematic circuit diagram showing an ODT control circuit in accordance with a preferred embodiment of the present invention.

FIG. 3 is a schematic circuit diagram showing an ODT control circuit in accordance with a preferred embodiment of the present invention.

Figure 1:
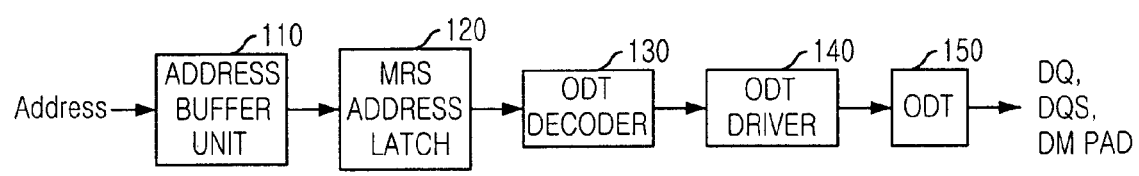
FIG. 1 is a block diagram showing a conventional ODT control circuit.
Figure 2:
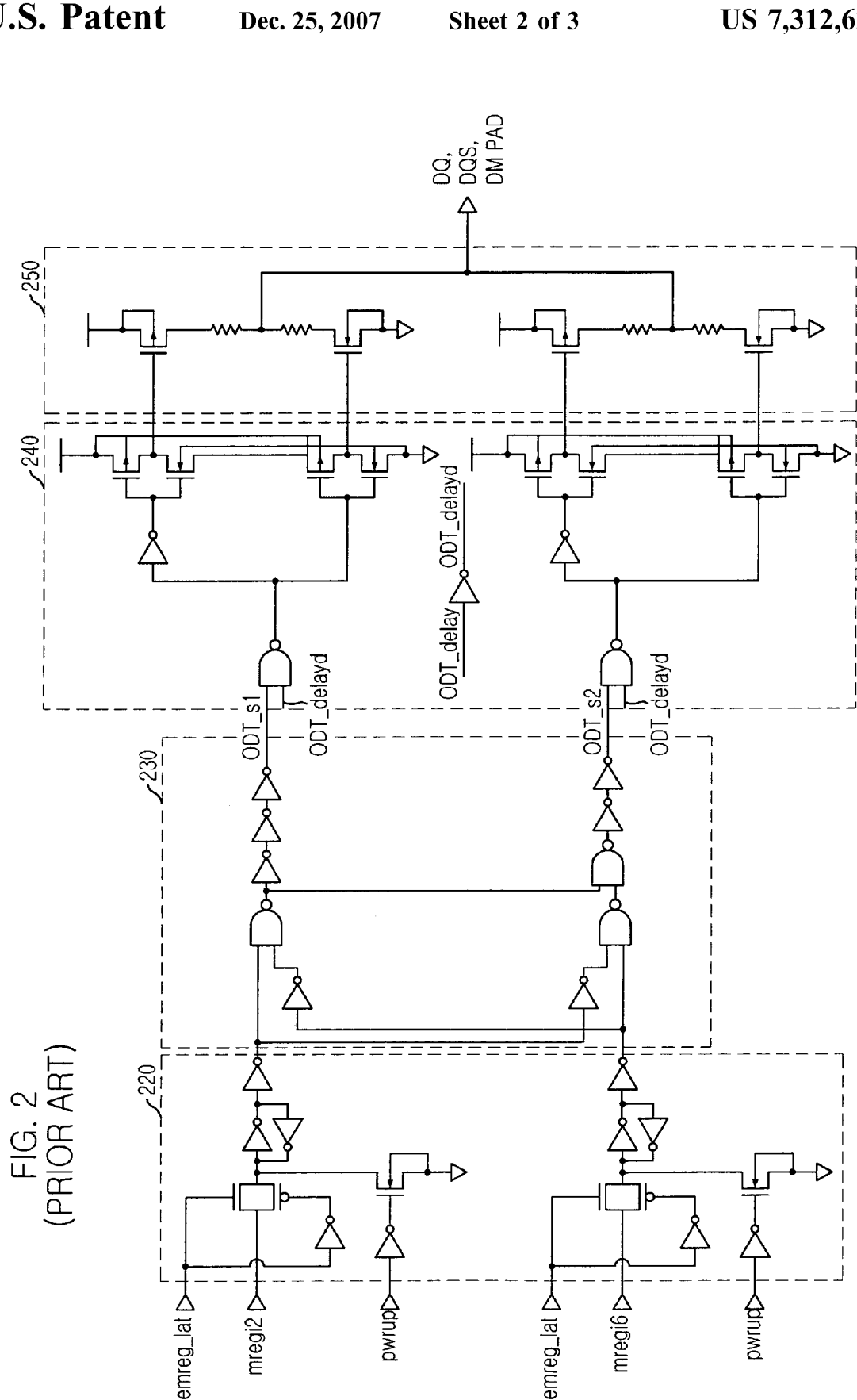
FIG. 2 is a schematic circuit diagram showing the conventional ODT control circuit.

In comparison with the conventional ODT control circuit, a structure of an ODT decoder 330 included in the ODT control circuit is different from that of the ODT decoder 230 shown in FIG. 2.

Table. 3 shows output signals of the ODT decoder 330 according to addresses A6 and A2.

TABLE 3

| A6 | A2 | S1 | S2 |
|----|----|----|----|
| 0 | 0 | 0 | 0 |
| 0 | 1 | 1 | 1 |
| 1 | 0 | 0 | 1 |
| 1 | 1 | Keep previous value | |

As shown in Table. 3, in comparison with the conventional ODT control circuit, the ODT control circuit shown in FIG. 3 can hold previous output signals when addresses A6 and A2 are in a logic high level.

The ODT decoder 330 includes a latch unit 331 and a decoding unit 332.

The latch unit 331 receives a plurality of input signals and holds previous output signals of the latch unit 331 if the plurality of input signals are in a predetermined logic level. The decoding unit 332 decodes output signals of the latch unit 331 in order to satisfy the JEDEC specification.

That is, if both of input signals emreg2d and emreg6d are in a logic high level, the latch unit 331 holds its previous output signals. At this time, since output signals of the latch unit 331 are not changed, output signals of the decoding unit 332 are not changed either. For the above-mentioned purpose, the latch unit 331 is formed by a NAND latch circuit using a two-input NAND gate.

Therefore, in accordance with the present invention, the ODT operation can be stably performed even if the addresses A6 and A2 are abnormally inputted due to a noise or a glitch.

The present application contains subject matter related to Korean patent application No. 2003-98514, filed in the Korean Patent Office on Dec. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A decoding circuit of an on die termination (ODT) control circuit, comprising:
    a latch unit including a NAND latch circuit for holding previous output signals of the latch unit when a plurality of input signals are respectively in predetermined logic levels; and
    a decoding unit for decoding output signals of the latch unit in order to control ODT operation,
    wherein the NAND latch circuit includes;
    a first NAND gate for receiving a first input signal and an output signal of a second NAND gate; and
    the second NAND gate for receiving a second input signal and an output signal of the first NAND gate.

2. The decoding circuit as recited in claim 1, wherein the ODT operation is controlled according to logic levels of the output signals of the latch unit, wherein the logic levels for controlling the ODT operation are determined based on a specification of Joint Electron Device Engineering Council (JEDEC), and the predetermined logic levels are excluded from the logic levels for controlling the ODT operation.

3. The decoding circuit as recited in claim 1, wherein the decoding unit includes:
    an inverter for inverting the output signal of the first NAND gate; and
    a third NAND gate for receiving output signals of the first NAND gate and the second NAND gate.

4. The decoding circuit as recited in claim 1, wherein each of the predetermined logic levels is in a first logic level.

5. The decoding circuit as recited in claim 4, wherein the first logic level is a logic high level.

6. An ODT driving circuit for use in a semiconductor memory device, comprising:
    a mode register set latch for latching an extended mode register set (EMRS) data simultaneously receiving the EMRS data and a trigger signal;
    a latch unit for receiving a plurality of input signals outputted from the mode register set latch and for holding previous output signals of the latch unit when the plurality of input signals are in predetermined logic level;
    a decoding unit for decoding output signals of the latch unit in order to control ODT operation;
    a driving unit for generating an ODT driving signal based on output signals of the decoding unit; and
    an ODT unit for generating a termination resister (RTT) based on the ODT driving signal.

7. The ODT driving circuit as recited in claim 6, wherein the ODT operation is controlled according to logic levels of the output signals of the latch unit, wherein the logic levels for controlling the ODT operation are determined based on a specification of Joint Electron Device Engineering Council (JEDEC), and the predetermined logic levels are excluded from the logic levels for controlling the ODT operation.

8. The ODT driving circuit as recited in claim 7, wherein the latch unit is a NAND latch circuit using a two-input NAND gate.

9. The ODT driving circuit as recited in claim 8, wherein the NAND latch circuit includes:
  a first NAND gate for receiving a first input signal and an output signal of a second NAND gate; and
  the second NAND gate for receiving a second input signal and an output signal of the first NAND gate.

10. The ODT driving circuit as recited in claim 9, wherein the decoding unit includes:
  an inverter for inverting the output signal of the first NAND gate; and
  a third NAND gate for receiving output signals of the first NAND gate and the second NAND gate.

11. The ODT driving circuit as recited in claim 6, wherein each of the predetermined logic levels is in a first logic level.

12. A method for decoding an ODT control signal, comprising the steps of:
  a.) holding the previous value when a plurality of input signals are respectively in a high logic level, regardless of a result of combining the input signal logically,
  b.) decoding the plurality of input signals when the plurality of input signals are not in the high logic level; and
  c.) decoding an outrut signal thereby controlling ODT operation,
  wherein the input signals includes an extended mode register set (EMRS) data.

13. The method as recited in claim 12, wherein logic levels of the plurality of input signals are determined based on a specification of Joint Electron Device Engineering Council (JEDEC), and the high logic level is excluded from logic levels for an ODT operation.

14. A method for driving an ODT in a semiconductor memory device, comprising the steps of;
  a) latching an EMRS data by simultaneously receiving the EMRS data and a trigger signal;
  b) receiving a plurality of input signals generated at the step of a) and holding output signals if the plurality of input signals are in predetermined logic levels;
  c) decoding output signals generated at the step of b);
  d) generating an ODT driving signal based on output signals generated at the step of c); and
  e) generating a termination resistor (RTT) based on the ODT driving signal.

15. The method as recited in claim 14, wherein logic levels of the plurality of input signals are determined based on a specification of Joint Electron Device Engineering Council (JEDEC), and the predetermined logic levels are excluded from logic levels for an ODT operation.

16. The method as recited in claim 15, wherein each of the predetermined logic levels is in a first logic level.

17. A decoding circuit of an on die termination (ODT) control circuit, comprising:
  a latch unit latching and outputting a plurality of input signals as output signals of the latch, wherein previous output signals are outputted as current output signals when current input signals are respectively in predetermined logic levels; and
  a decoding unit for decoding the output signals of the latch unit in order to control ODT operation to logically combine the previous output signals when the current input signals are respectively in predetermined logic levels,
  wherein the input signal includes an extended mode register set (EMRS) data.

* * * * *